(12) United States Patent
Orlowski et al.

(10) Patent No.: US 11,464,106 B2
(45) Date of Patent: Oct. 4, 2022

(54) FIDUCIALS FOR LAMINATE STRUCTURES

(71) Applicant: Qorvo US, Inc., Greensboro, NC (US)

(72) Inventors: John August Orlowski, Summerfield, NC (US); Stephen Craig Parker, Burlington, NC (US); James Edwin Culler, Jr., Lexington, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/383,752

(22) Filed: Apr. 15, 2019

(65) Prior Publication Data
US 2020/0288567 A1    Sep. 10, 2020

Related U.S. Application Data

(60) Provisional application No. 62/815,375, filed on Mar. 8, 2019.

(51) Int. Cl.
*H05K 1/02* (2006.01)
*H05K 3/04* (2006.01)
*H05K 1/05* (2006.01)

(52) U.S. Cl.
CPC ............ *H05K 1/0266* (2013.01); *H05K 1/05* (2013.01); *H05K 3/048* (2013.01); *H05K 2201/0715* (2013.01); *H05K 2201/09918* (2013.01)

(58) Field of Classification Search
CPC ................... H05K 1/0266; H05K 1/05; H05K 2201/0715; H05K 2201/09918; H05K 3/048
(Continued)

(56) References Cited

U.S. PATENT DOCUMENTS 4,916,260 A * 4/1990 Broaddus ............. H05K 3/4641
174/268
6,130,015 A    10/2000 Noddin et al.
(Continued)

FOREIGN PATENT DOCUMENTS

GB    2258183 A    2/1993
JP    2007059627 A    3/2007

OTHER PUBLICATIONS

International Search Report and Written Opinion for International Patent Application No. PCT/US2020/021404, dated Jun. 24, 2020, 15 pages.

*Primary Examiner* — Tremesha S Willis
(74) *Attorney, Agent, or Firm* — Withrow & Terranova, P.L.L.C.

(57) ABSTRACT

Laminate structures and configurations of fiducials for laminates structures for electronic devices are disclosed. Fiducials are formed in laminate structures to provide increased visibility and contrast, thereby improving detection of the fiducials with optical detection equipment of automated machines commonly used in the electronics industry. Fiducials are disclosed that are defined by openings in laminate structures that extend to depths within the laminate structures to provide sufficient contrast. Openings for fiducials may be arranged to extend through multiple metal layers and dielectric layers of the laminate structures. The fiducials may be formed by laser drilling or other subtractive processing techniques. Fiducials as disclosed herein may be coated with additional layers or coatings, such as a metal coating that includes an electromagnetic shield for electronic devices, and the fiducials are configured with sufficient visibility and contrast to remain detectable through the additional layers or coatings.

17 Claims, 9 Drawing Sheets

(58) Field of Classification Search
USPC ........................................................ 174/250
See application file for complete search history.

(56) References Cited

U.S. PATENT DOCUMENTS

| | | | |
|---|---|---|---|
| 8,062,930 B1 | 11/2011 | Shah et al. | |
| 2004/0071019 A1* | 4/2004 | Magnus | B82Y 10/00 365/200 |
| 2006/0087031 A1 | 4/2006 | Gardner et al. | |
| 2008/0099860 A1* | 5/2008 | Wuertz | B81C 1/00246 257/415 |
| 2009/0014410 A1 | 1/2009 | Yokai et al. | |
| 2010/0310829 A1 | 12/2010 | Yada | |
| 2015/0125625 A1 | 5/2015 | Huang et al. | |
| 2018/0366597 A1* | 12/2018 | Carlson | H01L 31/0747 |
| 2019/0363037 A1* | 11/2019 | Kume | H01L 21/76843 |

\* cited by examiner

FIDUCIALS FOR LAMINATE STRUCTURES

RELATED APPLICATIONS

This application claims the benefit of provisional patent application Ser. No. 62/815,375, filed Mar. 8, 2019, the disclosure of which is hereby incorporated herein by reference in its entirety.

FIELD OF THE DISCLOSURE

The present disclosure relates to laminate structures for electronic devices, and particularly to fiducials for laminate structures.

BACKGROUND

Electronic substrates are often used to support and connect electrical components and electronic modules. Laminate structures, such as printed circuit boards and the like, are commonly used as electronic substrates for electronic devices. A typical laminate structure may include a non-conductive body for support and one or more conductive features for connecting the electrical components or electronic modules. The conductive features may be any type of conductive structure exposed at a surface of the non-conductive body and may include contact pads, conductive traces, surface-exposed sections of vias, and the like. Electrical components such as resistors, capacitors, inductors, resonators, bond wires, and integrated circuits (ICs) are mounted to one or more of the conductive features by a soldering process. For example, the conductive features may include one or more contact pads connected to one another by one or more conductive traces. Accordingly, one or more circuits can be formed on the laminate structure. One or more electrical components that are mounted on the laminate structure can be arranged to form an electronic device or module.

In typical fabrication processes, many electronic modules can be formed concurrently across a common laminate structure before individual electronic modules or groups of electronic modules are singulated. In this manner, common manufacturing steps and processes may be sequentially performed at high speeds to concurrently form large quantities of electronic modules. Electronic component placement tools may be utilized to place and mount electronic components across common laminate structures to form the electronic modules. After the electronic modules are formed, singulation may include separating the laminate structure along peripheral boundaries of individual electronic modules or around groups of electronic modules. Fiducials, or recognition marks, are typically employed to indicate the mounting locations of various electronic components on the laminate structure or to indicate the locations of singulation lines for the electronic modules.

The art continues to seek improved electronic devices and related fabrication techniques capable of overcoming challenges associated with conventional electronic devices.

SUMMARY

The present disclosure relates to laminate structures for electronic devices and more particularly to configurations of fiducials for laminate structures. Laminate structures as disclosed herein may include one or more metal layers and dielectric layers that form a support structure for one or more electronic components or modules that are mounted thereon. Fiducials are disclosed that are formed in the laminate structure to provide increased visibility and contrast, thereby improving detection of the fiducials with optical detection equipment of automated machines commonly used in the electronics industry. In certain embodiments, a fiducial is defined by an opening in the laminate structure that extends to a depth within the laminate structure that provides sufficient contrast. Openings for fiducials may be arranged to extend through multiple metal layers and dielectric layers of the laminate structure. In certain embodiments, the openings for the fiducials are formed by a subtractive process, such as laser drilling. In certain embodiments, the fiducial may be coated with additional layers or coatings, such as a metal coating that includes an electromagnetic shield for electronic devices that are mounted on the laminate structure, and the fiducial is configured with sufficient visibility and contrast to be detectable through the additional layers or coatings.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
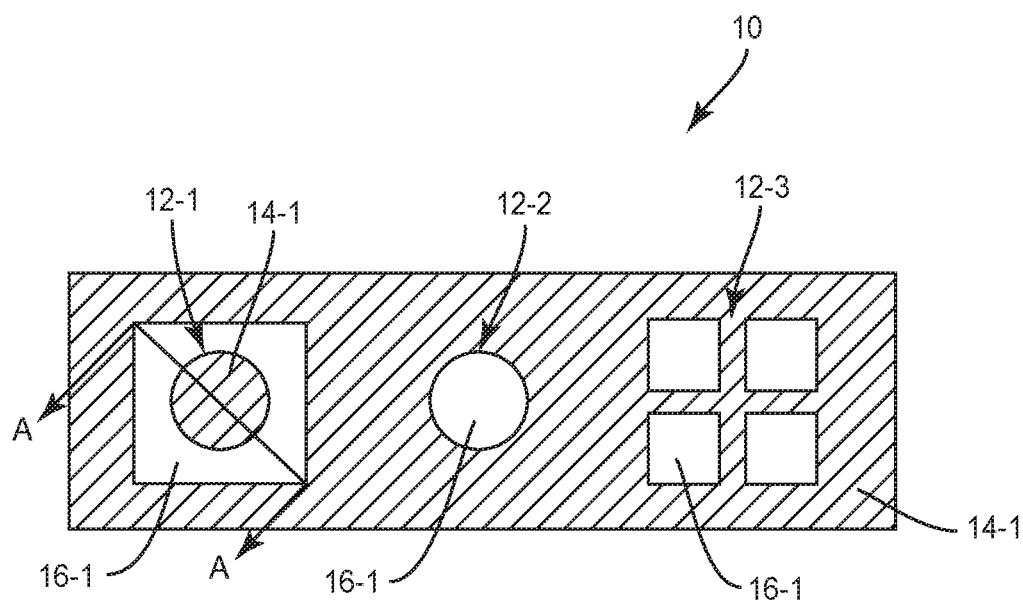
FIG. 1A is a top view of a laminate structure on which several fiducials have been formed.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to laminate structures for electronic devices and more particularly to configurations of fiducials for laminate structures. Laminate structures as disclosed herein may include one or more metal layers and dielectric layers that form a support structure for one or more electronic components or modules that are mounted thereon. Fiducials are disclosed that are formed in the laminate structure to provide increased visibility and contrast, thereby improving detection of the fiducials with optical detection equipment of automated machines commonly used in the electronics industry. In certain embodiments, a fiducial is defined by an opening in the laminate structure that extends to a depth within the laminate structure that provides sufficient contrast. Openings for fiducials may be arranged to extend through multiple metal layers and dielectric layers of the laminate structure. In certain embodiments, the openings for the fiducials are formed by a subtractive process, such as laser drilling. In certain embodiments, the fiducial may be coated with additional layers or coatings, such as a metal coating that includes an electromagnetic shield for electronic devices that are mounted on the laminate structure, and the fiducial is configured with sufficient visibility and contrast to be detectable through the additional layers or coatings.

Fiducials, or recognition marks, have many uses in the electronics industry, including the indication of mounting locations for various electronic components or to indicate the locations of singulation lines for electronic components or electronic modules during fabrication. Fiducials are typically placed in various locations across an electronic substrate and automated equipment is configured with optical detection equipment such as a camera to detect the locations of the fiducials and accordingly perform subsequent fabrication steps. For example, pick-and-place machines may be configured to detect various fiducials with a camera and accordingly place various electronic components at the various fiducial locations. In another example, dicing machines may be configured to detect fiducials with a camera and accordingly scribe, break, saw, or cut electronic devices along dicing lines or streets that are registered with the fiducials.

Figure 1B:
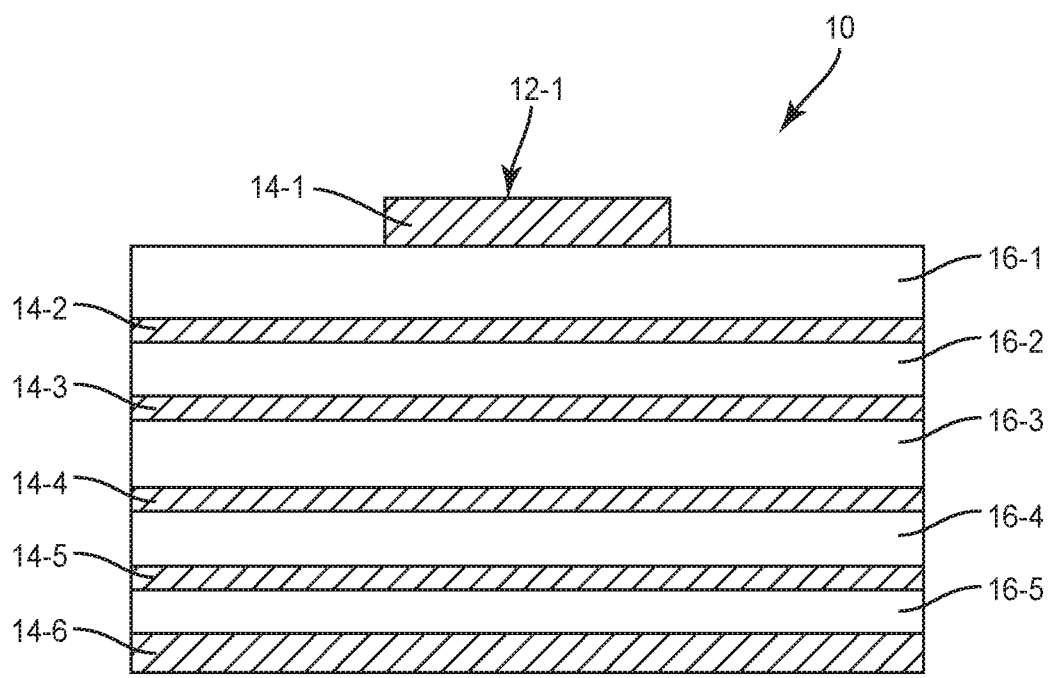
FIG. 1B is a cross-sectional view taken along the section line A-A of FIG. 1A

FIG. 1A is a top view of a laminate structure 10 on which several fiducials 12-1 to 12-3 have been formed. FIG. 1B is a cross-sectional view taken along the section line A-A of FIG. 1A. The laminate structure 10 includes a plurality of metal layers 14-1 to 14-6 and a plurality of dielectric layers 16-1 to 16-5. The laminate structure 10 may comprise a printed circuit board where the plurality of metal layers 14-1 to 14-6 are laminated in an alternating configuration with the plurality of dielectric layers 16-1 to 16-5. While six metal layers 14-1 to 14-6 are illustrated, the laminate structure may be configured with any number of metal layers. Generally, increasing the number of laminated metal layers corresponds to an increased number of electronic components that may be mounted and electrically connected on a particular laminate structure. This allows electrical connections to various electronic components to be made at different horizontal planes within the laminate structure 10. In certain embodiments, the plurality of metal layers 14-1 to 14-6 may include copper (Cu), copper foil, or the like while the plurality of dielectric layers 16-1 to 16-5 may include fiber materials, glass, epoxy, glass-reinforced epoxy, ceramic materials, polymer materials and combinations thereof. The fiducials 12-1 to 12-3 may be formed on the laminate structure 10 in locations that are spaced apart from mounting regions for various electronic components. Depending on the detection equipment utilized, the fiducials 12-1 to 12-3 may form any number of shapes including circles, crosses, squares, rectangles, and ovals, among others. As illustrated in FIG. 1A, the fiducial 12-1 is formed with a circular shape in a portion of the first metal layer 14-1 where boundaries of the circular shape are defined by a pattern of the first metal layer 14-1. A clearance section that is devoid of the first metal layer 14-1 is formed adjacent to the boundaries of the fiducial 12-1, and accordingly, the first dielectric layer 16-1 is visible in the clearance section. In another example, the fiducial 12-2 also forms a circular shape where boundaries of the circular shape are defined by a pattern of the first metal layer 14-1; however, the fiducial 12-2 is formed by an area of the laminate structure 10 that is devoid of the first metal layer 14-1. In yet another example, the fiducial 12-3 forms a cross or plus symbol that is also defined by a pattern of the first metal layer 14-1. Each of the fiducials 12-1 to 12-3 may be formed by selectively removing or selectively depositing the first metal layer 14-1. In this manner, the fiducials 12-1 to 12-3 are formed by patterns of the first metal layer 14-1 and portions of the first dielectric layer 16-1 that are visible through the patterns of the first metal layer 14-1. Accordingly, a depth of each of the fiducials 12-1 to 12-3 is defined by a thickness of the first metal layer 14-1. Depending on the application, the laminate structure 10 may be subsequently coated with one or more additional layers (e.g., dielectrics, metals, etc.) in fabrication steps associated with various electronic components that are mounted to the laminate structure 10. If the fiducials 12-1 to 12-3 are also coated with the one or more additional layers, the visibility and/or contrast of the fiducials 12-1 to 12-3 may be reduced, making it more difficult for automated machines to detect the precise location of the fiducials 12-1 to 12-3.

Figure 2:
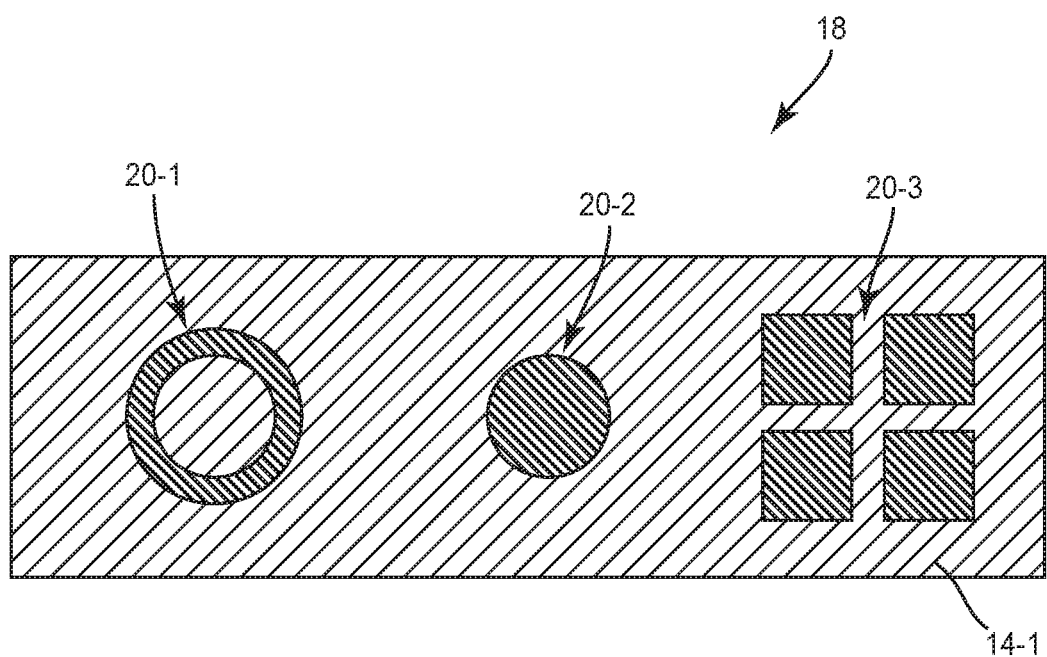
FIG. 2 is a top view of a laminate structure where several fiducials have been formed with increased depths into the laminate structure according to embodiments disclosed herein.

FIG. 2 is a top view of a laminate structure 18 where several fiducials 20-1 to 20-3 have been formed with increased depths into the laminate structure 18 according to embodiments disclosed herein. The first metal layer 14-1 as previously described is visible from the top view. The fiducial 20-1 is formed with a circular shape in a portion of the first metal layer 14-1 where an outer boundary of the circular shape is defined by a circular pattern of the first metal layer 14-1. Within the outer boundary, a ring-shaped area is formed that is devoid of the first metal layer 14-1. The ring-shaped area is configured to extend into the laminate structure 18 to a depth sufficient to provide improved visibility and contrast of the fiducial 20-1. The fiducial 20-2 also forms a circular shape where an outer boundary of the circular shape is defined by a pattern of the first metal layer 14-1; however, the entire area within the outer boundary of the circular shape is devoid of the first metal layer 14-1 and extends into the laminate structure 18 to a similar depth. The fiducial 20-3 forms a cross or plus symbol that is also defined by a pattern of the first metal layer 14-1. In this manner, each of the fiducials 20-1 to 20-3 are formed in the laminate structure 18 and each of the fiducials 20-1 to 20-3 are defined by one or more openings of the first metal layer 14-1.

Figure 3A:
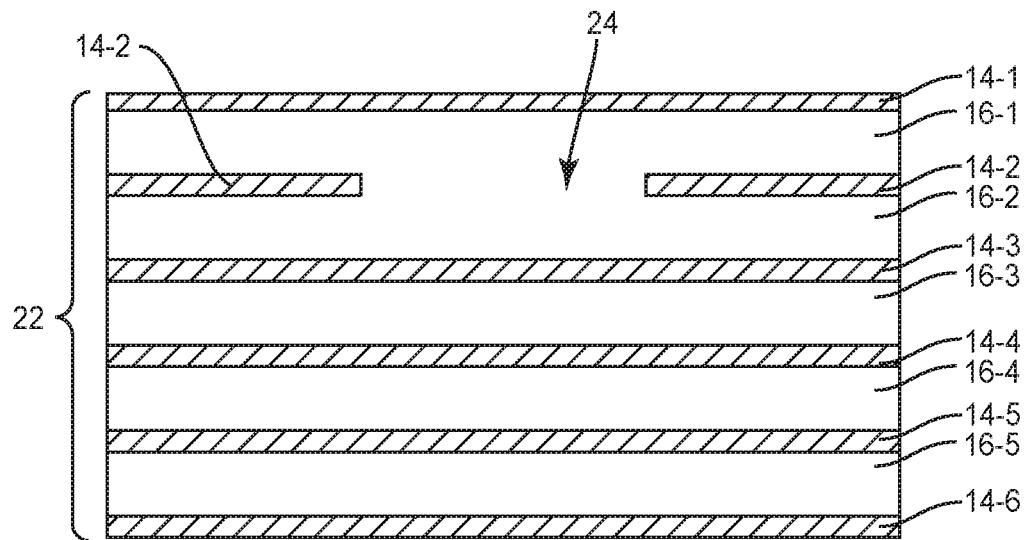
FIG. 3A is a cross-sectional view of a laminate structure before any fiducials have been formed.

FIGS. 3A to 3E illustrate cross-sectional views taken at various stages of fabrication for fiducials according to embodiments disclosed herein. FIG. 3A is a cross-sectional view of a laminate structure 22 before any fiducials have been formed. The laminate structure 22 includes the plurality of metal layers 14-1 to 14-6 and the plurality of dielectric layers 16-1 to 16-5 as previously described. As illustrated, the second metal layer 14-2 is formed with an opening 24 such that the second metal layer 14-2 does not extend across the same area of the laminate structure 22 as the other metal layers 14-1, 14-3 to 14-6. In this regard, the first dielectric layer 16-1 and the second dielectric layer 16-2 may be continuous within the opening 24. The opening 24 of the second metal layer 14-2 is formed during fabrication of the laminate structure 22 and may include selectively depositing a pattern of the second metal layer 14-2 to form the opening 24 or blanket depositing the second metal layer 14-2 and selectively removing a portion of the second metal layer 14-2 to form the opening 24.

Figure 3B:
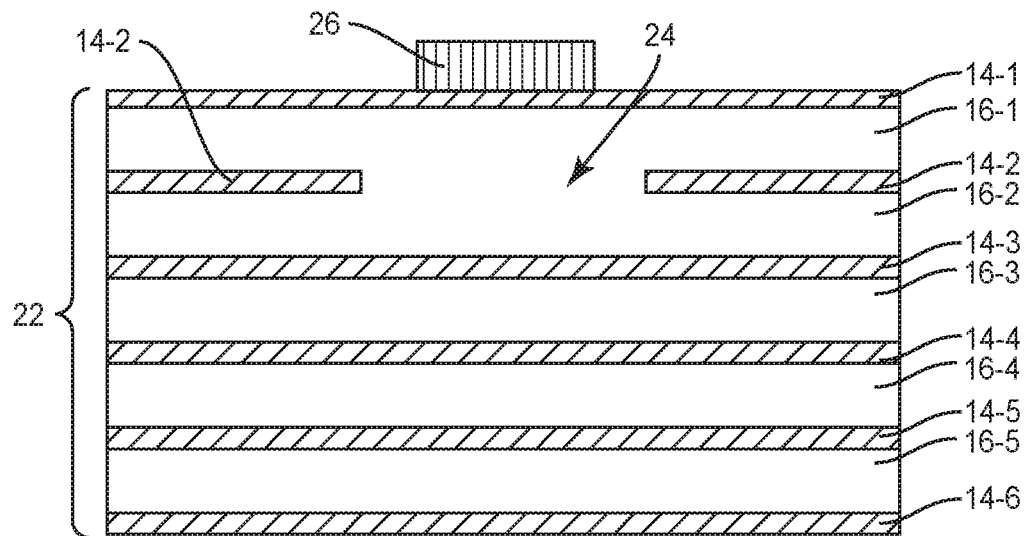
FIG. 3B is a cross-sectional view of the laminate structure of FIG. 3A after a resist layer has been patterned on the laminate structure.
Figure 3C:
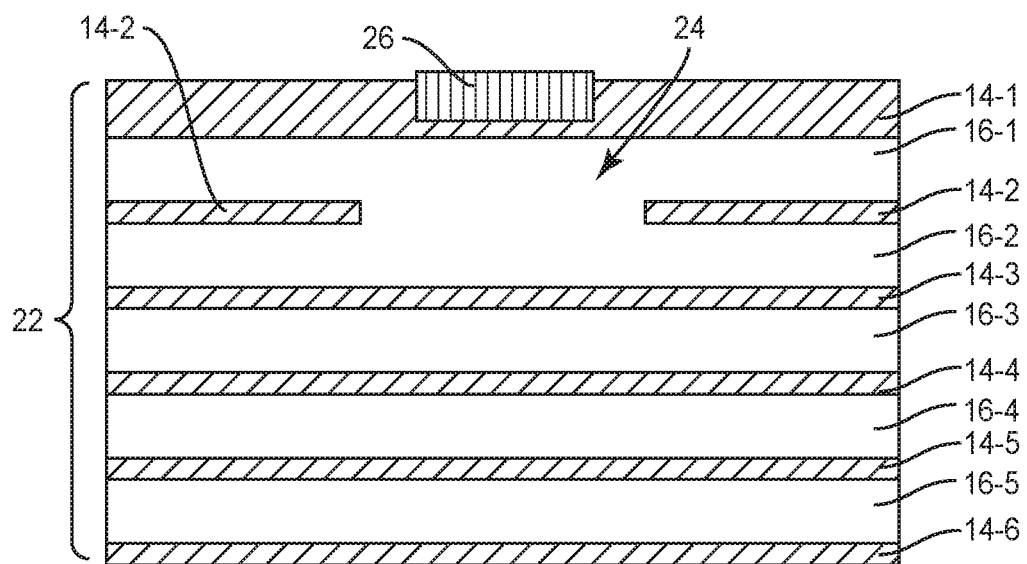
FIG. 3C is a cross-sectional view of the laminate structure of FIG. 3B after a thickness of a first metal layer has been increased in certain areas.
Figure 3D:
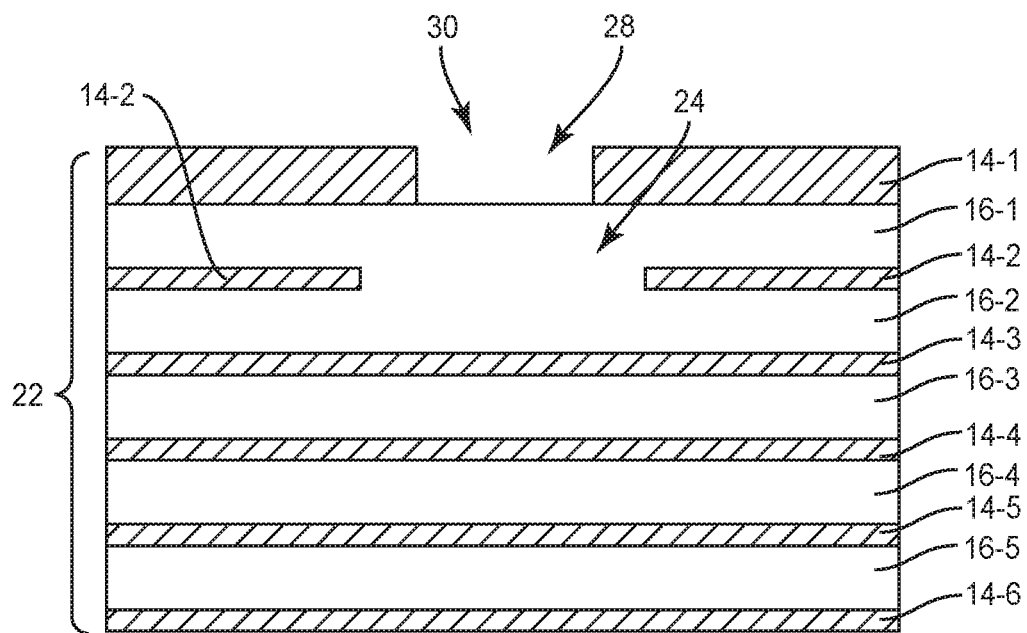
FIG. 3D is a cross-sectional view of the laminate structure of FIG. 3C after the resist layer has been removed.

FIG. 3B is a cross-sectional view of the laminate structure 22 of FIG. 3A after a resist layer 26 has been patterned on the laminate structure 22. The resist layer 26 may be patterned by various methods, including lithography and photolithography. In FIG. 3B, the resist layer 26 is formed on the laminate structure 22 and is registered with the opening 24 of the second metal layer 14-2. FIG. 3C is a cross-sectional view of the laminate structure 22 of FIG. 3B after a thickness of the first metal layer 14-1 has been increased in certain areas. As illustrated, additional material of the first metal layer 14-1 may be formed on the laminate structure 22 around the resist layer 26. In this regard, a thin portion of the first metal layer 14-1 is formed that is between the resist layer 26 and the first dielectric layer 16-1. In certain examples where the first metal layer 14-1 comprises Cu, the thickness of the first metal layer 14-1 may be increased by depositing additional Cu material by a plating process or other deposition techniques around the resist layer 26. In other embodiments, a material that is different from the first metal layer 14-1 may be deposited around the resist layer 26. FIG. 3D is a cross-sectional view of the laminate structure 22 after the resist layer 26 of FIG. 3C has been removed. In particular, the resist layer 26 of FIG. 3C may be stripped off of the laminate structure 22, and the thinner portion of the first metal layer 14-1 that was directly under the resist layer 26 of FIG. 3C may be etched or otherwise removed to form an opening 28 that is defined by a pattern of the first metal layer 14-1. In this manner, a fiducial 30 that is similar to the fiducial 12-2 of FIG. 1A may be formed where boundaries of the fiducial 30 are defined by a pattern of the first metal layer 14-1. Due to the increased thickness of the first metal layer 14-1 in FIG. 3D, the fiducial 30 is formed with a greater depth into the laminate structure 22 than the fiducial 12-2 of FIG. 1A, thereby providing improved contrast when viewed from above the laminate structure 22. As illustrated, the opening 28 is registered with the opening 24 of the second metal layer 14-2.

Figure 3E:
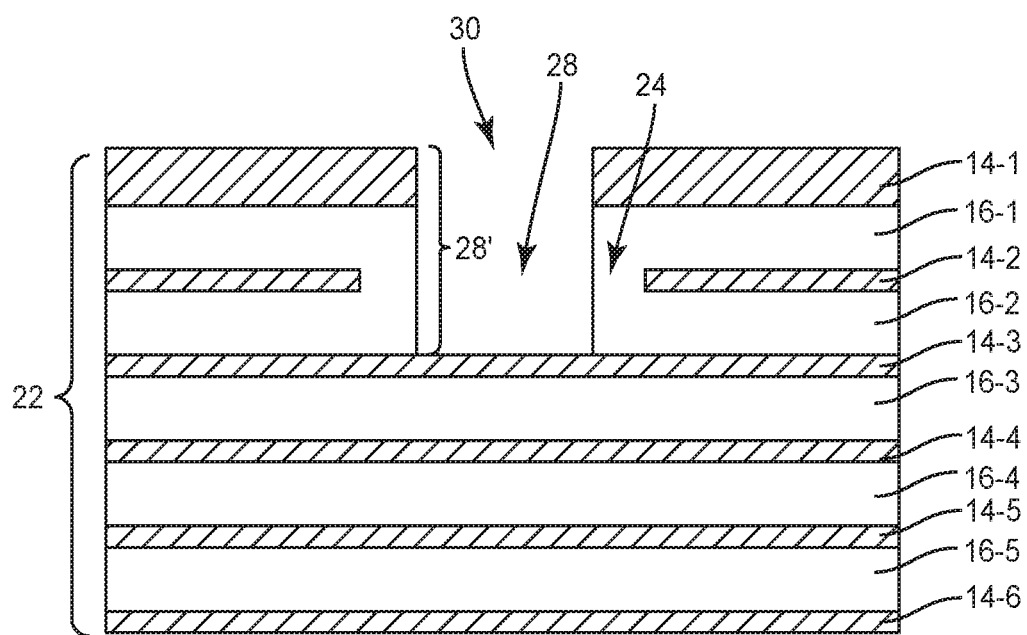
FIG. 3E is a cross-sectional view of the laminate structure of FIG. 3D after a depth of a fiducial is increased into the laminate structure.

FIG. 3E is a cross-sectional view of the laminate structure 22 of FIG. 3D after a depth of the fiducial 30 is increased even further into the laminate structure 22. As illustrated, portions of the first and second dielectric layers 16-1, 16-2 that were registered with the opening 28 are removed such that the opening 28 is configured to extend to the third metal layer 14-3. In this regard, the shape of the opening 28 is defined by a pattern of the first metal layer 14-1, the first dielectric layer 16-1, and the second dielectric layer 16-2, and the fiducial 30 comprises a surface of the third metal layer 14-3 that is exposed by the opening 28. Notably, the opening 28 is thereby configured to extend through the opening 24 of the second metal layer 14-2. Accordingly, the fiducial 30 is formed in the laminate structure 22 and the fiducial 30 is defined by the opening 28 that extends through the first metal layer 14-1, the first dielectric layer 16-1, and the second metal layer 14-2. In particular a width of the opening 28 may define a width of the fiducial 30. In certain embodiments, a sidewall 28' of the opening 28 comprises a portion of the first metal layer 14-1 and a portion of the first dielectric layer 16-1. The sidewall 28' may also comprise a portion of the second dielectric layer 16-2. In this manner, the sidewall 28' may also refer to a sidewall of the laminate structure 22 that is within the opening 28 and the sidewall 28' may also be configured to define at least a portion of the fiducial 30. In certain embodiments, the opening 24 in the second metal layer 14-2 is configured with a larger width across the laminate structure 22 than a width of the opening 28. In this regard, the sidewall 28' may be devoid of the second metal layer 14-2. Accordingly, the fiducial 30 is configured to extend further into the laminate structure 22, thereby providing even further improved visibility and contrast when viewed from above the laminate structure 22. Additionally, at least some portions of the fiducial 30 are defined by edges of the first metal layer 14-1 at the opening 28, thereby forming a well-defined edge for optical detection equipment.

In order to remove portions of the first and second dielectric layers 16-1, 16-2 that were registered with the opening 28, a selective removal process may be performed on the laminate structure 22 in certain embodiments. The selective removal process may comprise laser drilling where pulsed laser energy from a laser source such as a carbon dioxide ($CO_2$) laser is applied to the laminate structure 22 at the opening 28. The laser energy may be configured to be absorbed by and promote ablation of the first and second dielectric layers 16-1, 16-2. Additionally, the laser energy may be configured to have reduced absorption by the metal layers 14-1, 14-3. In this regard, the laser energy may be applied over a wider area of the laminate structure 22 and the shape of the fiducial 30 will be defined by the pattern or opening 28 that extends through the first metal layer 14-1. Ablation of the first and second dielectric layers 16-1, 16-2 will occur and may thereby end at the exposed surface of the third metal layer 14-3. In this manner, different depths of fiducials 30 may be configured by initially arranging additional openings of various metal layers within the laminate structure 22. For example, during fabrication of the laminate structure 22, the third metal layer 14-3 may be formed with an opening similar to the opening 24 of the second metal layer 14-2. Accordingly, a laser drilling process may ablate portions of the first, second, and third dielectric layers 16-1 to 16-3 before stopping at the fourth metal layer 14-4. Other subtractive removal steps are contemplated, including mechanical drilling or cutting, and etching, among others.

Figure 4A:
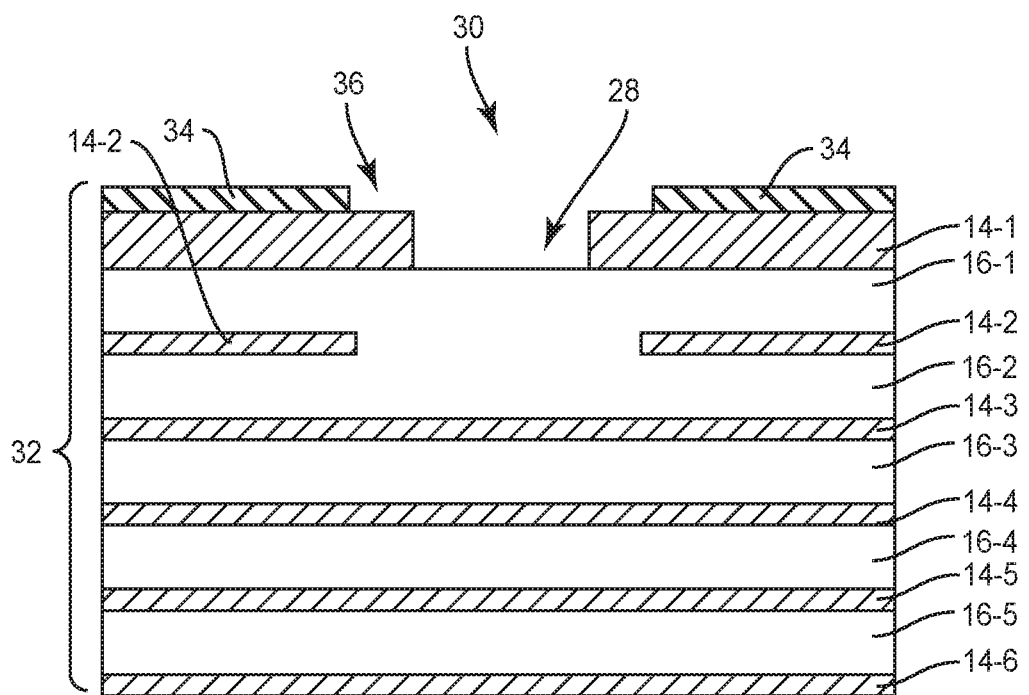
FIG. 4A is a cross-sectional view of a laminate structure that includes a solder mask according to embodiments disclosed herein.

FIG. 4A is a cross-sectional view of a laminate structure 32 that includes a solder mask 34 according to embodiments disclosed herein. The laminate structure 32 is similar to the laminate structure 22 of FIG. 3D and accordingly includes the metal layers 14-1-14-6, the dielectric layers 16-1-16-5, the opening 28 that is defined by a pattern of the first metal layer 14-1, and the fiducial 30 as previously described. Depending on the application and the type of components intended to be mounted on other locations of the laminate structure 32, the solder mask 34 may be configured to provide electrical isolation on the top of the laminate structure 32 as well as to provide oxidation protection. Notably, the solder mask 34 may be configured on the first metal layer 14-1 to form a solder mask opening 36 that is registered with the fiducial 30. In certain embodiments, the solder mask opening 36 is configured with a larger width across the laminate structure 32 than a width of the fiducial 30 across the laminate structure 32. Accordingly, a portion of the first metal layer 14-1 that is closest to the opening 28 may be devoid of the solder mask 34 to provide access to the opening 28 in subsequent processing steps as well as to provide increased visibility of the fiducial 30.

Figure 4B:
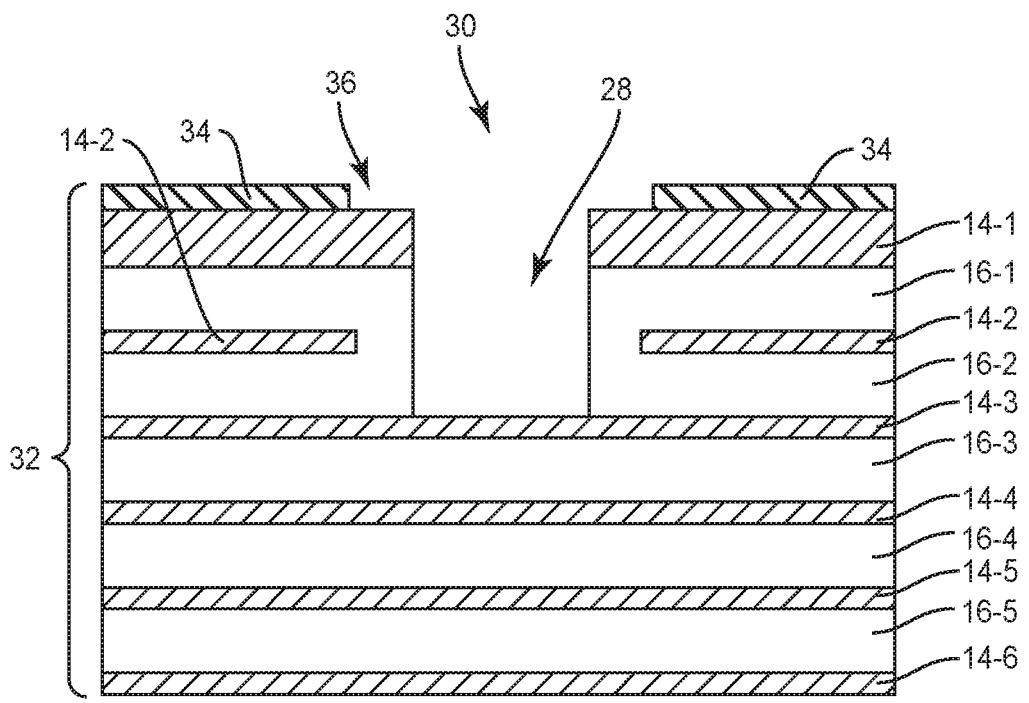
FIG. 4B is a cross-sectional view of the laminate structure of FIG. 4A after a depth of a fiducial is increased.

FIG. 4B is a cross-sectional view of the laminate structure 32 of FIG. 4A after a depth of the fiducial 30 is increased. The depth of the fiducial 30 may be increased by a subtractive material process, such as the laser drilling as previously described for FIG. 3E. By configuring the width of the solder mask opening 36 to be larger than the width of the fiducial 30, laser energy from a laser drilling process may be applied to the opening 28, and the pattern of the first metal layer 14-1 that defines the opening 28 may also define the portions of the first and second dielectric layers 16-1, 16-2 that are ablated.

In certain embodiments, one or more additional layers or coatings may be applied to surfaces of laminate structures as disclosed herein. Depending on the desired application and the electrical components that may be accordingly mounted on a laminate structure, one or more additional layers may include additional dielectric coatings and/or additional metal coatings, among others. For example, electrical components or modules on a laminate structure may be coated with one or more metal coatings to form an electromagnetic shield for reducing electromagnetic interference or crosstalk between different ones of the electrical components or modules. An electromagnetic shield may include one or more thin metal layers sequentially deposited over a laminate structure to cover a particular electrical component or module. An electromagnetic shield may also include one or more metal particles or flecks suspended in a binder. During deposition, fiducials that are provided in the laminate structure may also be coated with the electromagnetic shield coatings. According to configurations of fiducials as disclosed herein, fiducials may be coated with additional layers or coatings and still maintain sufficient visibility and contrast to be viewed and detected with automated processing equipment.

Figure 5A:
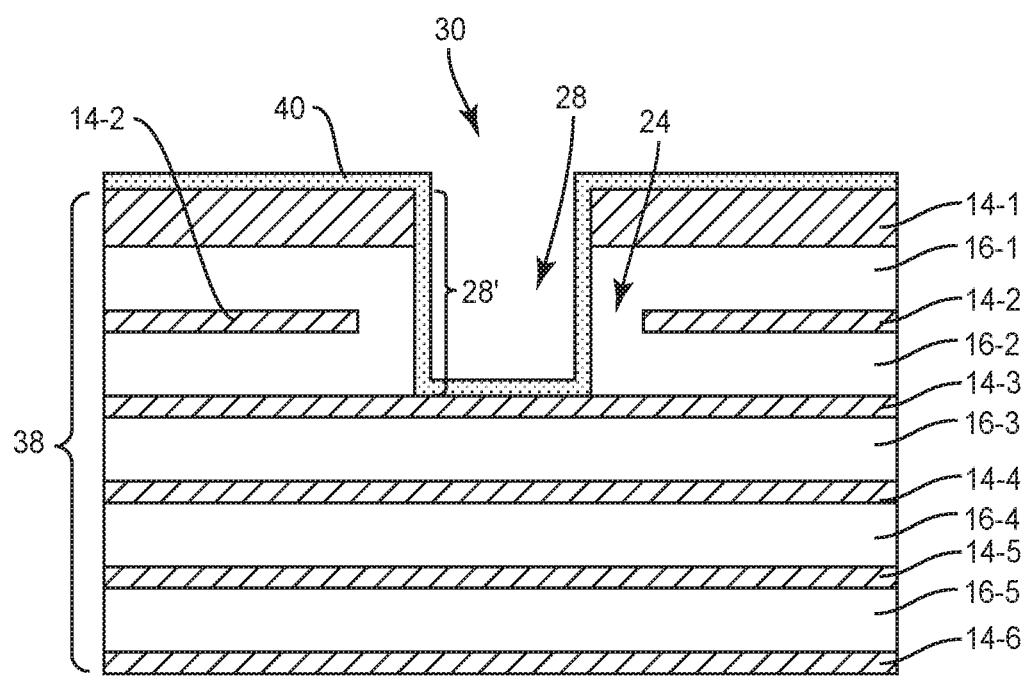
FIG. 5A is cross-sectional view of a laminate structure that includes a metal coating on the laminate structure according to embodiments disclosed herein.

FIG. 5A is cross-sectional view of a laminate structure 38 that includes a metal coating 40 on the laminate structure 38 according to embodiments disclosed herein. In certain embodiments, the metal coating 40 may comprise one or more layers or sub-layers that form an electromagnetic shield for electrical components or modules that are mounted in other locations of the laminate structure 38. The metal coating 40 may be deposited by one or more combinations of electroless plating, electrolytic plating, other plating processes, sputtering, dispensing, and spraying, among others. In certain embodiments, the metal coating 40 comprises one or more layers of Cu, nickel (Ni), and combinations thereof. For example, the metal coating 40 may comprise a first layer of electroless Cu, a second layer of electrolytic Cu, and a third layer of electrolytic Ni to form an electromagnetic shield. In other embodiments, the metal coating 40 comprises conductive metal particles or flecks that are suspended or filled in an epoxy material or binder to form an electromagnetic shield. In such embodiments, the epoxy material may be filed with one or more combinations of conductive metal particles or flecks of Cu, silver (Ag), tin/zinc alloys (Sn/Zn), or other conductive materials. The laminate structure 38 in FIG. 5A is similar to the laminate structure 22 of FIG. 3E and accordingly includes the metal layers 14-1 to 14-6, the dielectric layers 16-1 to 16-5, the opening 28 that is defined by a pattern of the first metal layer 14-1, and the fiducial 30 as previously described. During deposition of the metal coating 40, the opening 28 may also be covered by the metal coating 40. In this regard, the metal coating 40 may be configured to extend into the opening 28 and to cover the sidewall 28'. In certain embodiments, the metal coating 40 may be configured to extend into the opening 28 to cover the surface of the third metal layer 14-3 that is exposed by the opening 28. As illustrated, the fiducial 30 is defined by the opening 28 and the metal coating 40 is configured to cover one or more surfaces of the laminate structure 38 that are outside of the opening 28 (e.g., top surfaces of the first metal layer 14-1) as well as one or more surfaces of the laminate structure 38 that are within the opening 28 (e.g., the sidewall 28' and a portion of the third metal layer 14-3).

Figure 5B:
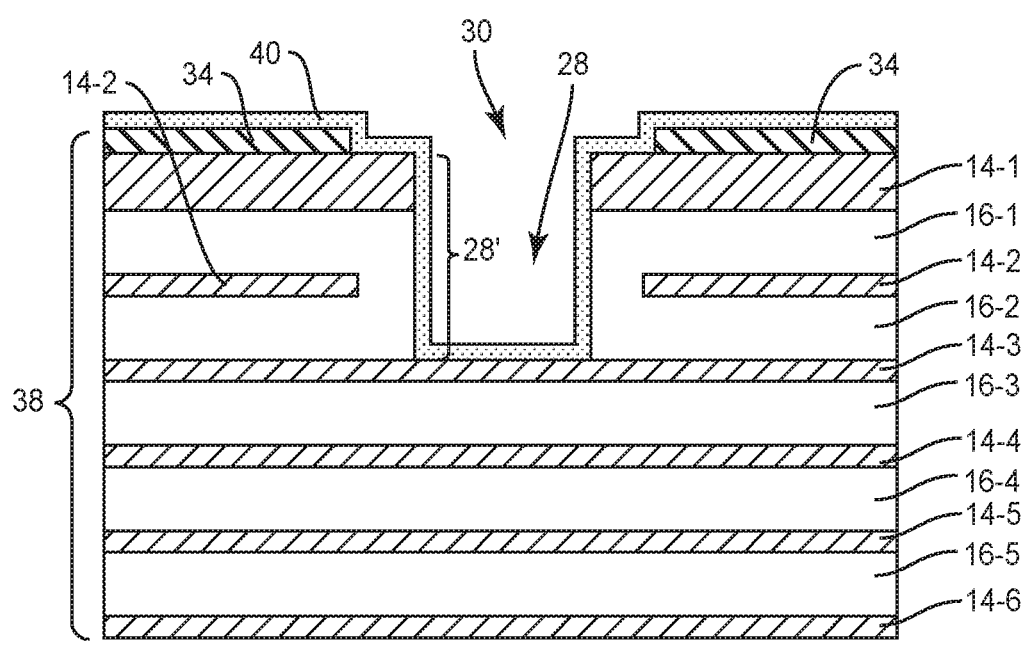
FIG. 5B is a cross-sectional view of the laminate structure of FIG. 5A for embodiments that include a solder mask as illustrated in FIG. 4A and FIG. 4B.

FIG. 5B is a cross-sectional view of the laminate structure 38 of FIG. 5A for embodiments that include the solder mask 34 as described for FIG. 4A and FIG. 4B. As illustrated, the solder mask 34 may be configured as previously described and the metal coating 40 may subsequently be formed on the laminate structure 38 to cover at least a portion of the solder mask 34. In this regard, the metal coating 40 may also be configured to cover portions of the first metal layer 14-1 that are uncovered by the solder mask 34, and the metal coating 40 may also be configured to extend into the opening 28 as previously described. In certain embodiments, the metal coating 40 covers the sidewall 28' of the opening 28 as well as a portion of the third metal layer 14-3 within the opening 28.

In the fabrication of electronic devices, a laminate structure as disclosed herein may be populated with arrays of one or more electronic components that form an array of electronic modules. The electronic components are mounted on and electrically connected to one or more of the metal layers of the laminate structure. After fabrication of the array of electronic modules, the laminate structure may be diced or singulated along dicing lines or streets that extend between individual ones or groups of electronic modules, thereby forming a plurality of separated electronic modules. Fiducials as described herein may be provided at various locations in the laminate structure. In certain embodiments, fiducials are placed to identify the location of the dicing lines for dicing equipment. In certain embodiments, fiducials may also be placed to identify the locations where individual electronic components are to be mounted for placement equipment.

Figure 6A:
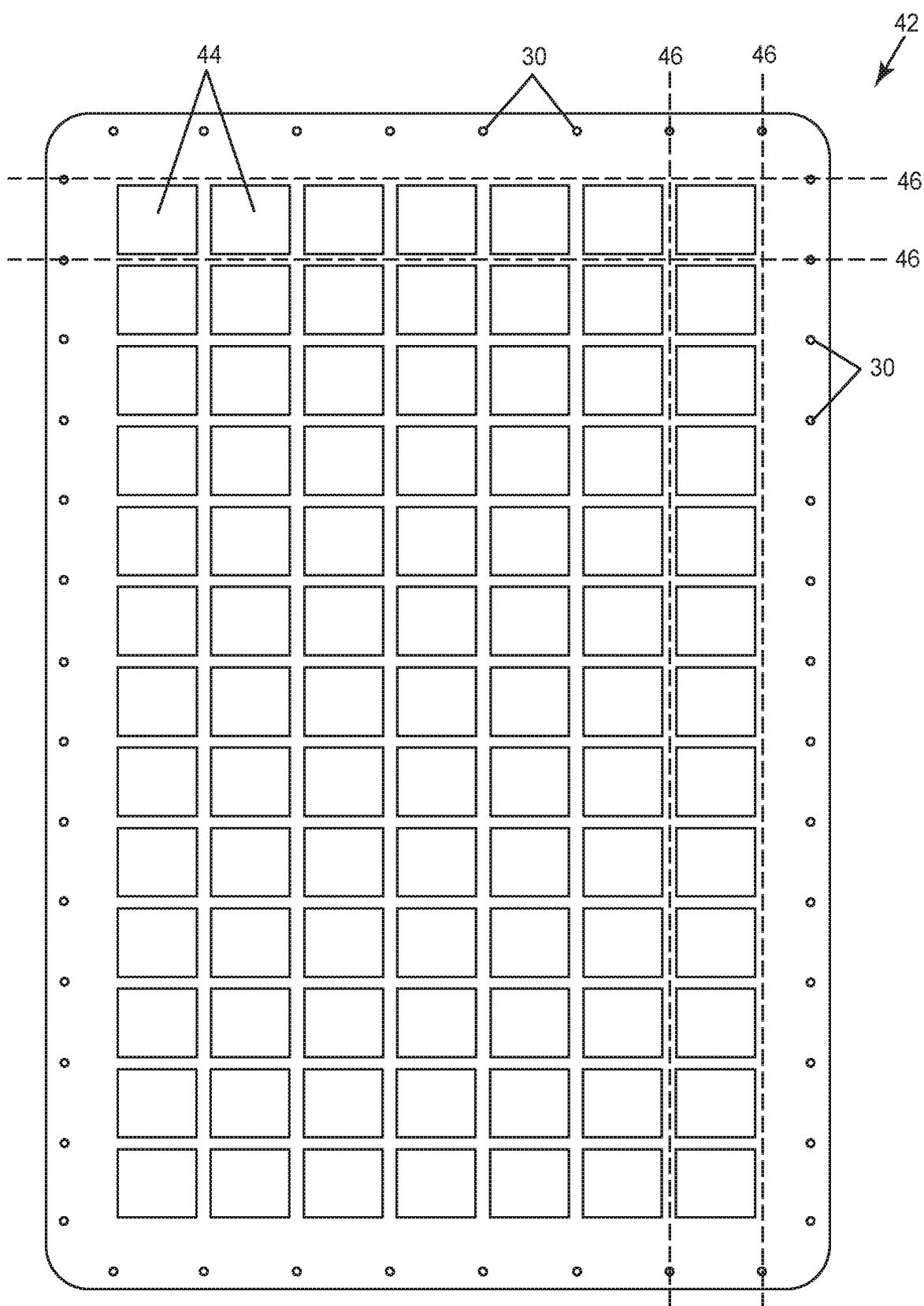
FIG. 6A is a top view of a representative laminate structure on which a plurality of electronic modules have been mounted to form an array of the electronic modules.

FIG. 6A is a top view of a representative laminate structure 42 on which a plurality of electronic modules 44 have been mounted to form an array of the electronic modules 44. Depending on the application, various combinations of one or more electrical components including resistors, capacitors, inductors, resonators, bond wires, and ICs may form each of the electronic modules 44. Streets or dicing lines 46 are configured between rows and columns of the electronic modules 44. For simplicity, only a few dicing lines 46 are shown, but it is understood dicing lines 46 can be formed between every column and every row of the electronic modules 44. In certain embodiments, a plurality of fiducials 30 are arranged in the laminate structure 42 as previously described. As illustrated in FIG. 6A, the plurality of fiducials 30 are configured in areas of the laminate structure 42 that are spaced apart from where the electronic modules 44 are mounted. In particular, the fiducials 30 are arranged along the perimeter of the laminate structure 42 and the fiducials 30 are configured to be registered with or aligned with the dicing lines 46. In this manner, an automated dicing machine may be configured to detect the location of each fiducial 30 and properly align the machine to cut, saw, break, or otherwise separate the laminate structure 42 along each of the dicing lines 46. Accordingly, each of the fiducials 30 may comprise an alignment marker that indicates the location of each dicing line 46 for singulation. In certain embodiments, the dicing lines 46 or streets may comprise a width as measured by a distance between adjacent electronic modules 44 in a range of about 100 microns ($\mu$m) to about 500 $\mu$m. In order to provide alignment indication, the fiducials 30 are registered with the width of the dicing lines 46. In certain embodiments, the fiducials 30 may comprise a longest dimension across the surface (e.g., diameter for circular fiducials) of the laminate structure 42 that is approximately the same as the width of the dicing lines 46. In other embodiments, the fiducials 30 may comprise a longest dimension across the surface of the laminate structure 42 that is less than the width of the dicing lines 46. In still further embodiments, the fiducials 30 may comprise a longest dimension across the surface of the laminate structure 42 that is greater than the width of the dicing lines 46. In any of these embodiments, the fiducials 30 may be registered with the dicing lines 46 such that a center point of each fiducial 30 is aligned with at least one dicing line 46. In certain embodiments, the longest dimension of the fiducials 30 across the surface of the laminate structure 42 may include a range from about 100 $\mu$m to about 500 $\mu$m, or in a range from about 200 $\mu$m to about 400 $\mu$m, or in a range from about 250 $\mu$m to about 350 $\mu$m.

In other embodiments, the fiducials 30 may be provided in locations that are adjacent to each of the electronic modules 44 to indicate a mounting location for each of the electronic modules 44.

Figure 6B:
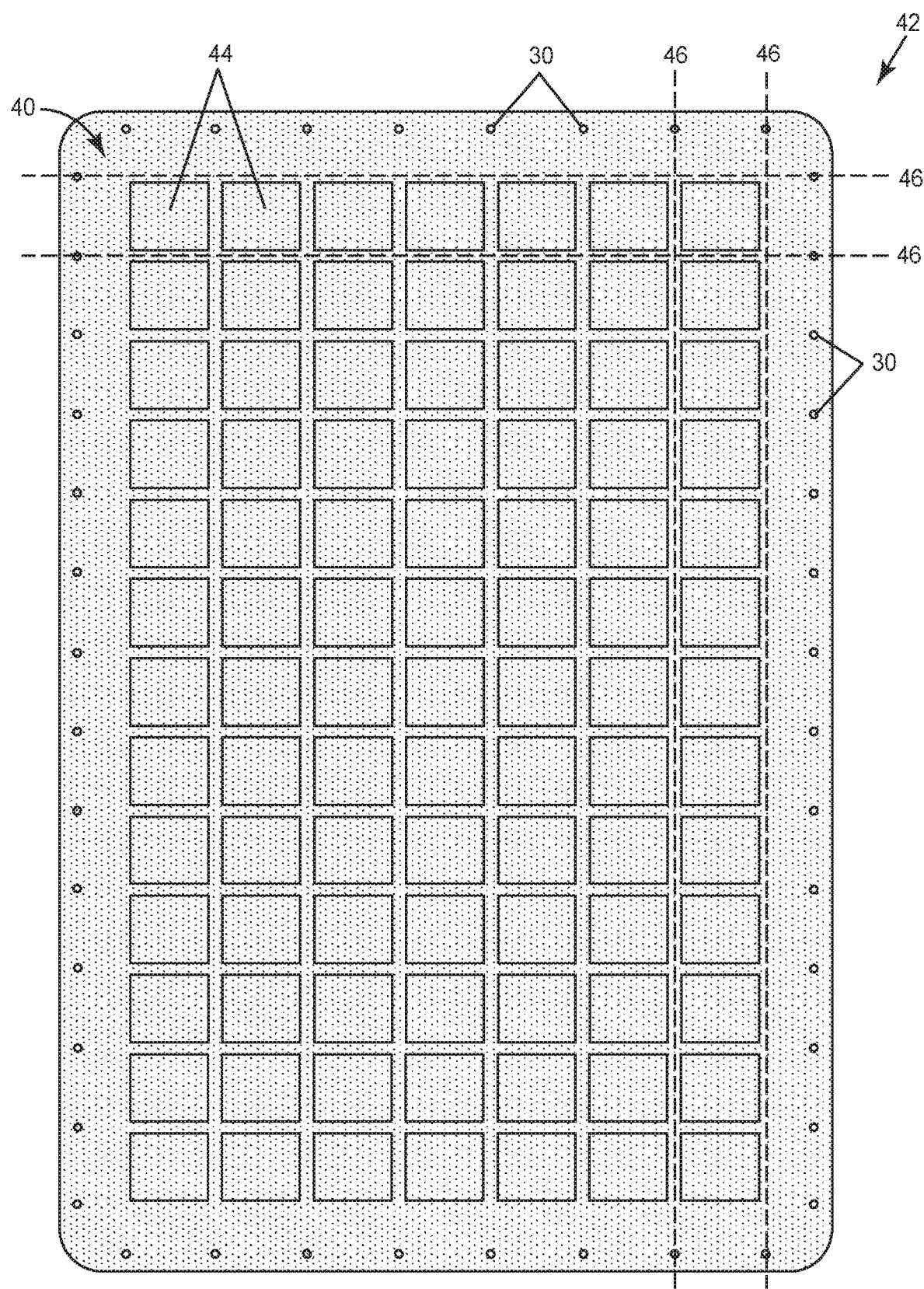
FIG. 6B is a top view of the laminate structure of FIG. 6A after a metal coating as illustrated in FIG. 5A and FIG. 5B has been formed.

FIG. 6B is a top view of the laminate structure 42 of FIG. 6A after the metal coating 40 as described for FIG. 5A and FIG. 5B has been formed. In certain embodiments, the metal coating 40 is blanket deposited across the plurality of electronic modules 44 and surfaces of the laminate structure 42 that are uncovered by the plurality of electronic modules 44. The metal coating 40 may comprise an electromagnetic shield as previously described. In this manner, each of the electronic modules 44 is coated with an electromagnetic shield that will remain on each of the electronic modules 44 after singulation along each of the dicing lines 46. As illustrated, when the metal coating 40 is blanket deposited across the laminate structure 42, the metal coating 40 may also be configured to coat the fiducials 30. The fiducials 30 as disclosed herein are provided with increased visibility and contrast at least partly due to the increased depth in which the fiducials 30 are formed within the laminate structure 42. In this manner, the metal coating 40 may not obscure the fiducials 30, thereby allowing the fiducials 30 to remain visible from the top view with sufficient contrast to be detected by cameras or other detection equipment of automated dicing equipment.

Those skilled in the art will recognize improvements and modifications to the preferred embodiments of the present disclosure. All such improvements and modifications are considered within the scope of the concepts disclosed herein and the claims that follow.

What is claimed is:
1. A device comprising:
   a laminate structure comprising a first metal layer, a second metal layer, a third metal layer, and a first dielectric layer that is arranged between and in contact with the first metal layer and the second metal layer, wherein the first metal layer is at a top surface of the laminate structure and a thickness of the first metal layer is greater than a thickness of the second metal layer;

a fiducial formed in the laminate structure, the fiducial defined by an opening that extends through the first metal layer, the first dielectric layer, and the second metal layer, and the opening extends to and is bounded by a horizontal surface of the third metal layer, such that the horizontal surface of the third metal layer covers a bottom of the opening; and an electronic module on a surface of the laminate structure, wherein the fiducial is formed in a portion of the laminate structure that is laterally spaced from the electronic module.

2. The device of claim 1, wherein a sidewall of the fiducial is formed within the opening, and the sidewall comprises a portion of the first metal layer and a portion of the first dielectric layer.

3. The device of claim 2, wherein the sidewall of the fiducial is devoid of the second metal layer.

4. The device of claim 2, further comprising a metal coating on the laminate structure, the metal coating configured to extend into the opening to cover the sidewall of the fiducial.

5. The device of claim 4, wherein the metal coating comprises an electromagnetic shield.

6. The device of claim 4, wherein the metal coating comprises at least one of copper and nickel.

7. The device of claim 1, wherein the fiducial comprises a surface of the third metal layer that is exposed by the opening.

8. The device of claim 7, further comprising a metal coating on the laminate structure, the metal coating configured to extend into the opening to cover the surface of the third metal layer.

9. The device of claim 1, wherein the laminate structure further comprises a solder mask on a surface of the first metal layer, the solder mask forming a solder mask opening that is registered with the fiducial.

10. The device of claim 9, wherein the solder mask opening is configured with a larger width across the laminate structure than a width of the fiducial across the laminate structure.

11. The device of claim 9, further comprising a metal coating on the laminate structure, the metal coating configured to cover at least a portion of the solder mask and extend into the opening.

12. The device of claim 1, wherein the electronic module is one of a plurality of electronic modules on the surface of the laminate structure, and wherein the fiducial comprises an alignment marker configured to indicate a location of a dicing line for singulation of the plurality of electronic modules.

13. The device of claim 1, wherein the fiducial comprises an alignment marker configured to indicate a mounting location of the electronic module.

14. A device comprising:

a laminate structure comprising a plurality of metal layers that are arranged in an alternating configuration with a plurality of dielectric layers;

a fiducial defined by an opening in the laminate structure, wherein the opening extends through first and second metal layers of the plurality of metal layers; and a metal coating on the laminate structure, wherein the metal coating is distinct from the first and second metal layers and the metal coating is arranged on at least one horizontal surface of the laminate structure that is outside the opening, on at least one horizontal surface of the laminate structure that covers a bottom of the opening, and on at least one sidewall of the opening.

15. The device of claim 14, wherein the opening extends through at least one dielectric layer of the plurality of dielectric layers.

16. The device of claim 14, wherein the at least one horizontal surface of the laminate structure at the bottom of the opening is defined by a surface of a third metal layer of the plurality of metal layers.

17. The device of claim 14, wherein the metal coating comprises an electromagnetic shield.

* * * * *